United States Patent
Hashim et al.

(10) Patent No.: US 7,439,787 B2
(45) Date of Patent: Oct. 21, 2008

(54) METHODS AND APPARATUS FOR A DIGITAL PULSE WIDTH MODULATOR USING MULTIPLE DELAY LOCKED LOOPS

(75) Inventors: Ahmed E. Hashim, Chandler, AZ (US); John M. Pigott, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 11/495,265

(22) Filed: Jul. 27, 2006

(65) Prior Publication Data

US 2008/0024179 A1   Jan. 31, 2008

(51) Int. Cl.
*H03K 3/017* (2006.01)
(52) U.S. Cl. ................................ 327/172; 327/291
(58) Field of Classification Search .................. None
See application file for complete search history.

(56) References Cited

U.S. PATENT DOCUMENTS

| | | | | |
|---|---|---|---|---|
| 6,452,432 B2 * | 9/2002 | Kim | ............................ | 327/158 |
| 6,750,688 B2 * | 6/2004 | Takai | ............................ | 327/158 |
| 6,798,258 B2 * | 9/2004 | Rieven | ............................ | 327/152 |
| 7,154,978 B2 * | 12/2006 | Juan et al. | ............................ | 375/376 |
| 7,202,719 B2 * | 4/2007 | Gabato et al. | ............................ | 327/158 |
| 2006/0022736 A1 * | 2/2006 | Gregorius | ............................ | 327/276 |

OTHER PUBLICATIONS

Bartoni, F., et al, "A High-Resolution DLL Based Digital-To-Time Converter for DDS Applications", IEEE International Frequency Control Symposium and PDA Exhibition, 2002, p. 649-653.

* cited by examiner

*Primary Examiner*—Cassandra Cox
(74) *Attorney, Agent, or Firm*—Ingrassia, Fisher & Lorenz, P.C.

(57) ABSTRACT

A pulse width modulation circuit includes a first delay-locked loop (DLL) circuit and a second DLL circuit. The first DLL is coupled to a first multiplexer and has a first set of delay stages, wherein the first DLL circuit is configured to receive an input clock signal and, through the first multiplexer, produce a first stage delay signal associated with the first set of delay stages, wherein the first stage delay signal leads the input clock signal by a first duration. The second DLL circuit is coupled to a second multiplexer and has a second set of delay stages, wherein the second DLL circuit is configured to receive the input clock signal and, through the second multiplexer, produce a second stage delay signal associated with the second set of delay stages, wherein the second stage delay signal lags the first stage delay signal by a second duration; wherein the first DLL circuit and second DLL circuit are operatively coupled to produce an output signal having a pulse width equal to the difference between the first duration and the second duration.

20 Claims, 2 Drawing Sheets

METHODS AND APPARATUS FOR A DIGITAL PULSE WIDTH MODULATOR USING MULTIPLE DELAY LOCKED LOOPS

TECHNICAL FIELD

The present invention relates generally to pulse-width modulation (PWM) systems and, more particularly, to a high-resolution digital PWM circuit.

BACKGROUND

In many electronic control systems, it is desirable to produce digital pulse-width modulation (DPWM) signals with high resolution—that is, to allow small adjustments in the pulse width. One common method of generating a DPWM signal is to use a traditional digital counter followed by a comparator. In such a system, a clock with a known frequency runs a counter, and the output of the counter is fed into a comparator that compares the clock count to the digital PWM command. The output of the comparator is high at the beginning of each cycle and is reset when the two codes match. This approach is limited in that it requires a very high frequency clock to achieve high resolution DPWM signals.

Another conventional method of generating a DPWM signal is to pass a clock signal through an $2^N$-stage delay-locked loop (DLL) with the DLL locked so that a single stage delay is equal to the required resolution. Each stage of the DLL is selectable via a $2^N$:1 multiplexer (or "MUX") with an N-bit DPWM command word tied to the MUX select. The difference between the input of the DLL and the output of the MUX will be the desired DPWM signal. With this approach, the clock frequency can be fixed to a relatively low value; however, a large number of delay stages will be needed for fine resolution, resulting in high power dissipation. In addition, the highest achievable resolution is limited by the fabrication method itself.

In other conventional systems, a medium-frequency clock is used to run both a counter and a DLL. The counter is used to resolve the m most significant bits (MSBs), while the remaining n=N−m least significant bits (LSBs) are resolved by the DLL. This approach combines the hardware efficiency of the counter-based method with the low frequency clock of the DLL method. However, the maximum resolution is still limited by the minimum designable delay for a given process. Also, to achieve n bits of LSB resolution, $2^n$ delay stages are required.

Another conventional method uses a two-stage approach, where the first stage is a DLL that resolves the MSBs, and the second stage takes in two consecutive tap-points of the DLL and uses a secondary DLL to ensure that the delay cell has the desired resolution. It is a monotonic (always increasing) DPWM, but is generally not practical for fine resolutions because it relies on very small changes in capacitance to generate the fine delay.

Accordingly, it would be desirable to provide DPWM circuits with improved resolution. Other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the scope or application of possible embodiments. Furthermore, there is no intention to be bound by any expressed or implied theory presented in the preceding technical field, background, brief summary or the following detailed description.

Various embodiments may be described herein in terms of functional and/or logical block components and various processing steps. It should be appreciated that such block components may be realized by any number of hardware, software, and/or firmware components configured to perform the specified functions. For the sake of brevity, conventional techniques related to signal processing, PWM systems, and analog circuitry are not described herein.

In general, the present invention relates to the use of multiple DLLs with slightly different stage delays to produce an output signal based on the difference between those stage delays. One DLL (in conjunction with a multiplexer) produces a signal that leads the clock signal, and another DLL (in conjunction with another multiplexer) produces a signal that lags the first DLL signal. A latch or other suitable state machine component is used to produce a pulse width modulation signal having a width that is equal to the difference between the delays of these two signals.

Figure 1:
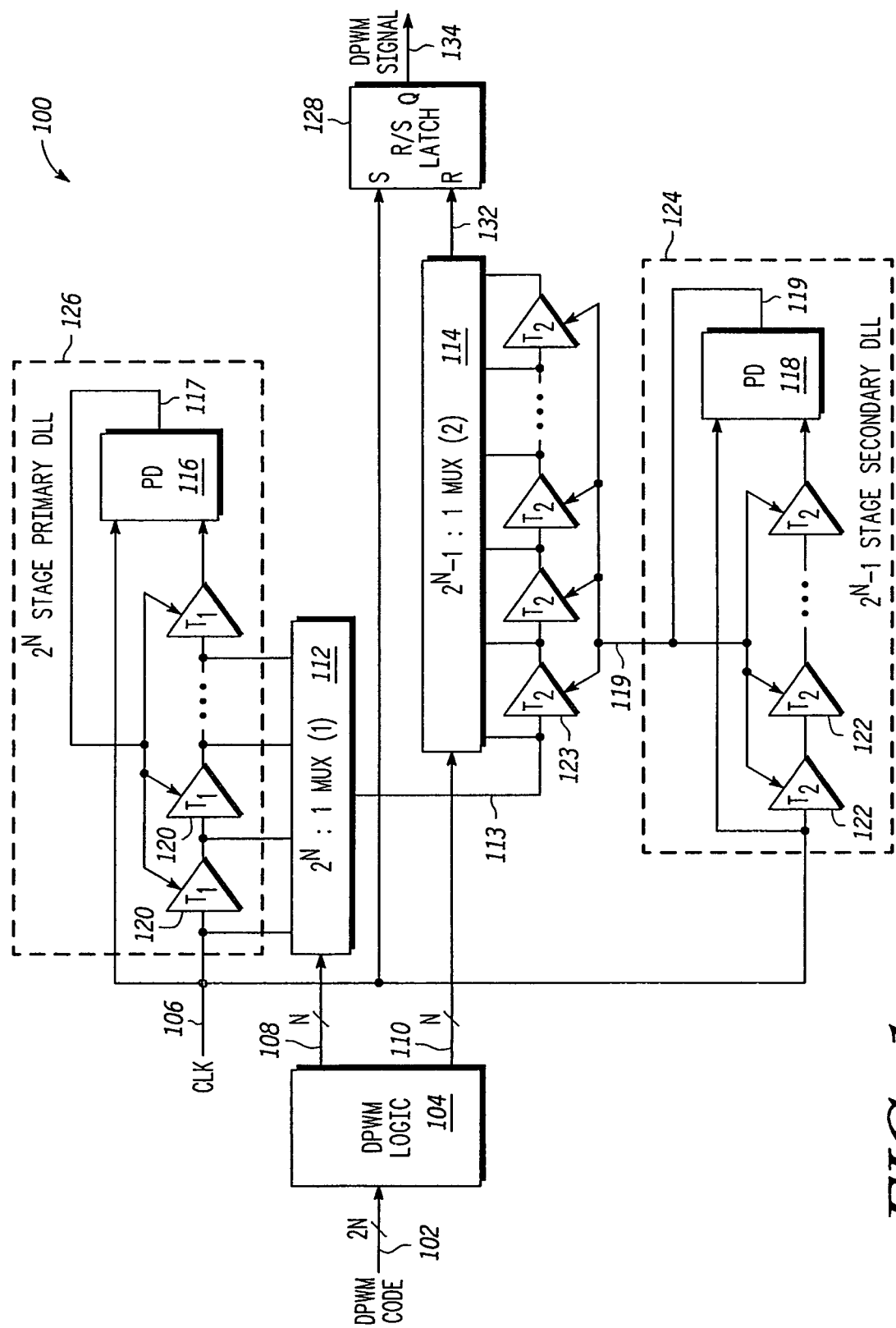
FIG. 1 is a schematic overview of a DPWM circuit in accordance with one embodiment.

Referring to FIG. 1, for example, a digital pulse width modulation (DPWM) circuit 100 in accordance with one embodiment generally includes a DPWM logic block 104 configured to accept a DPWM code 102, a primary DLL circuit 126, a secondary DLL circuit 124, a first multiplexer 112, a second multiplexer 114, and a latch ("S-R flip flop" or "R/S latch") 128 configured to produce a DPWM output signal 134. A clock signal ("CLK" or "reference clock") 106 provides a common clock signal for both DLL 126 and DLL 124.

In this embodiment, primary DLL 126 has $2^N$ stages, while secondary DLL 124 has fewer stages—e.g., $2^N-1$ stages, where N is any suitable positive integer value. For example, DLL 126 may have 16 stages, while DLL 124 has 15 stages. Other embodiments contemplate any circuit where the number of stages of DLL 124 is less than that of DLL 126. As is known in the art, a delay stage may be controlled (via a current or voltage) to adjust its delay.

DLL 126 includes a chain of $2^N$ delay elements (or "stages") 120, each having a delay of $T_1$ (equal to the period of the clock divided by the number of stages), which are tapped by multiplexer 112, producing a multiplexer output 113, which may be referred to herein as the "first stage delay signal." Phase detector 116 within DLL 126 receives the output of the variable delay chain (delay elements 120) as well as the input clock signal (CLK) 106, and produces an output 117 responsive to the phase error between the two signals. This phase error signal 117 is used to adjust the delay of delay elements 120, thus achieving the desired delay lock.

Secondary DLL 124 has a chain of $2^N-1$ delay elements 122, each having a delay $T_2$. Phase detector 118 compares the output of this chain with CLK 106, producing an output 119, which is used to adjust the delays 122. The output 113 of multiplexer 112 is used as the input to a third chain of delay elements 123. Delay elements 123 (as well as delay elements 122), each have a delay of $T_2$ because they are controlled via the output 119 of PD 118. The signal lines and arrows leading to delay elements 122 and 123 thus indicate that the delays of those elements are substantially equal and specified by signal 119 from phase detector 118. Delay elements 123 are tapped by multiplexer 114, which produces an output signal 132 (the "second stage delay signal"). Thus, DLL 126 locks to a stage delay of T/N, while DLL 124 locks to a slightly longer stage delay of T/(N−1).

DPWM code 102 (e.g., a 2N-bit code) is received by DPWM logic 104, which sends one code 108 (e.g., an N-bit code) to multiplexer 112, and another code 110 (e.g., another N-bit code) to multiplexer 114.

R/S latch 128 takes the output of multiplexer 114 (i.e., signal 132) as its "reset" input, and the CLK signal 106 as its "set" input. The Q output of R/S latch 128 then produces the desired DPWM signal 134. That is, RIS latch 128 is set at the rising edge of CLK 106, and is reset at the rising edge of the output of multiplexer 114. Those skilled in the art will recognize that latch 128 may be replaced by one or more other components (e.g., D-flip flops, NAND gates, or any suitable state machine) that fulfill the same or substantially same latching function.

The least significant bit (LSB) in this embodiment corresponds to ΔT—i.e., the difference between the rising edge of the clock input 106 and the rising edge of the output of MUX 114. Because the input and output of the DLL 126 should be in phase, the input to the Nth stage 120 can be viewed as leading the input of DLL 126 by $T_1$. If it is desired to resolve an LSB, DPWM logic 104 selects the output of multiplexer 114 to be the input of the Nth stage and multiplexer 114 to be the output of the first stage of the replica delay units. This allows the output of multiplexer 114 to be ΔT delayed from CLK 106. Thus, the output of multiplexer 114 lags input clock signal 106. In one embodiment, for example, a 20 MHz clock (T=50 ns) is used, with 16 delay stages in DLL 126, and 15 delay stages in DLL 124. Thus, $T_1$=50 ns/16=3.125 ns; and $T_2$=50 ns/15=3.333 ns. The expected ΔT for the output signal is thus 208 ps. It will be appreciated that these numbers are given merely as an example, and that other timing characteristics may be used in other embodiments.

Figure 2:
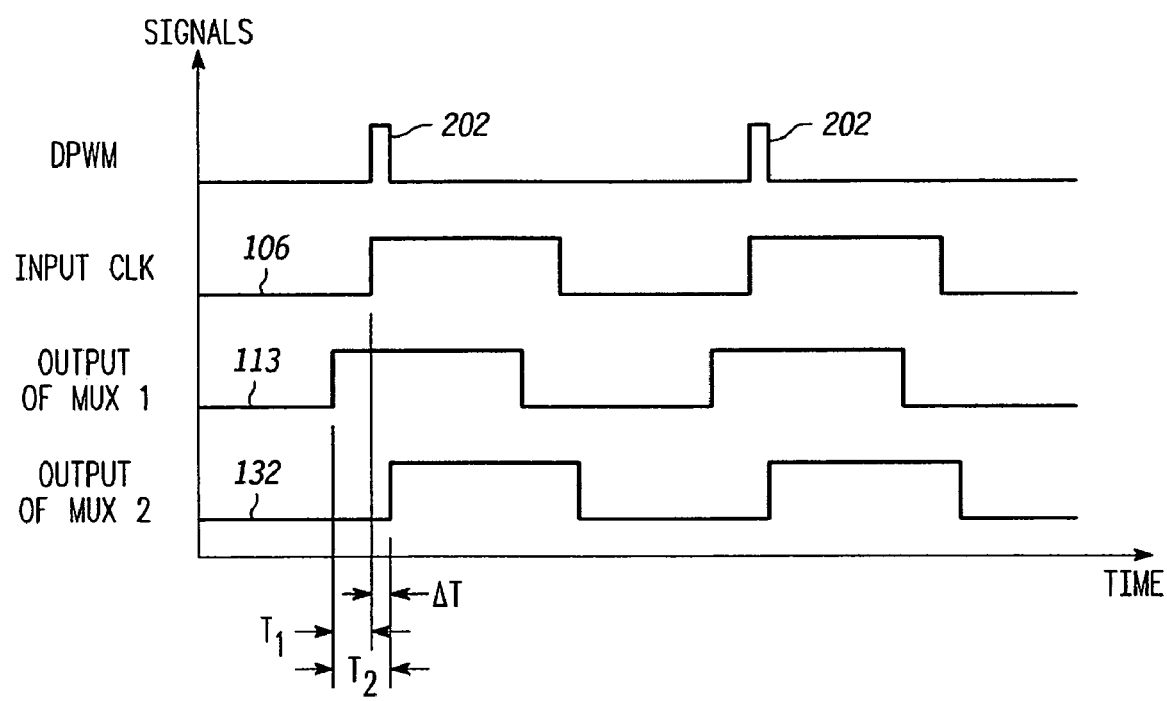
FIG. 2 depicts an exemplary clock timing diagram in accordance with the illustrated embodiment.

More particularly, referring to the timing diagram shown in FIG. 2, the exemplary DPWM circuit produces a multiplexer output (132) that is delayed by $T_2$ with respect to the output 113 of multiplexer 112. The output of multiplexer 114 is delayed by $T_1$ with respect to input CLK signal 106. This is illustrated in the topmost waveform, which shows the resulting output of latch 128, and is characterized by a series of pulses of width ΔT coincident with the rising edge of the input clock signal.

DPMW logic 104 takes in a 2N bit code 102 that commands the duty cycle and controls the two multiplexers. For example, if the desired duty cycle is $xT_1+y\Delta T$, this is equivalent to $(x-y)T_1+yT_2$, and thus logic 104 will set multiplexers 112 and 114 such that the CLK signal 106 passes through (x−y) $T_1$ units and y $T_2$ units. If x−y is a negative number, x−y+N is used. Since secondary DLL 124 has $2^N-1$ stages, it cannot resolve exactly N bits, so every N−1 LSBs will produce a redundant code. Logic 104 preferably takes this redundancy into account and skips a code every N−1 bits.

To achieve monotonicity, $T_{2,1}>T_{1,N}$; $(T_{2,1}+T_{2,2})>(T_{1,N}+T_{1,N-1})$, and so forth. That is, in general, while the embodiment illustrated in FIG. 1 depicts delays 120 that are substantially equal, delays 120 (and/or delays 122) may be configured such that each is less than or greater than previous delays in the stage.

It will be appreciated that the illustrated circuit allows finer PWM resolution using larger time steps, without the requirement of designing delay units on the order of magnitude of the resolution. That is, the illustrated embodiment uses 3N−2 delay units to achieve a $T/(N^2-N)$ resolution. This approach may be combined with a counter approach such that a medium clock frequency may be used. The most significant bits (MSBs) would then be resolved by the counter, while the LSBs are resolved in accordance with the methods described above.

In summary, what has been provided is a pulse width modulation circuit that includes a first delay-locked loop (DLL) circuit and a second DLL circuit. The first DLL is coupled to a first multiplexer and has a first set of delay stages, wherein the first DLL circuit is configured to receive an input clock signal and, through the first multiplexer, produce a first stage delay signal associated with the first set of delay stages, wherein the first stage delay signal leads the input clock signal by a first duration. The second DLL circuit is coupled to a second multiplexer and has a second set of delay stages, wherein the second DLL circuit is configured to receive the input clock signal and, through the second multiplexer, produce a second stage delay signal associated with the second set of delay stages, wherein the second stage delay signal lags the first stage delay signal by a second duration; wherein the first DLL circuit and second DLL circuit are operatively coupled to produce an output signal having a pulse width equal to the difference between the first duration and the second duration.

In one embodiment, the first DLL includes a first number of delay stages, the second DLL includes a second number of delay stages, and the second number is equal to the first number minus one. In a particular embodiment, the first number of delay stages is $2^N$, the second number of delay stages is $2^N-1$, where N is a positive integer.

The first DLL includes a first phase detector coupled to the input clock signal and the first set of delay stages, and the second DLL includes a second phase detector coupled to the input clock signal and the second set of delay stages and a third set of delay stages coupled to the second DLL. The system further includes a first multiplexer coupled to the first DLL, and a second multiplexer coupled to the second DLL and the third set of delay stages and the first multiplexer, wherein an output of the first multiplexer is used as a timing signal for the third set of delay stages.

The first DLL and third set of delay stages may be operatively coupled via a state machine component configured to produce the output signal based on an edge of the input clock signal and an edge of an output of the second multiplexer. In one embodiment, the state machine comprises an R/S latch, and the output signal is based on a rising edge of the input clock signal and a rising edge of the output of the second multiplexer.

In one embodiment, the second set of delay stages includes a plurality of delay stages having substantially equal delays. In another, the second set of delay stages includes a plurality of delay stages, each having a substantially different and monotonically increasing delay.

In one embodiment, the circuit further includes a logic circuit coupled to the first multiplexer and the second multiplexer, wherein the logic circuit is configured to accept a digital pulse width modulation code and send a corresponding first control code to the first multiplexer and a second control code to the second multiplexer.

In accordance with a specific embodiment, a digital pulse width modulation (DPWM) circuit comprises: a first digital locked loop (DLL) coupled to an input clock signal having a period T, wherein the first DLL includes n delay stages having a first delay, T/n; a first multiplexer coupled to the first DLL; a second DLL coupled to the input clock signal, wherein the second DLL includes m delay stages having a second delay, T/m, where m<n; a set of m delay stages coupled to the second DLL and having the same delay as the delay stages in the second DLL; a second multiplexer coupled to the delay stages coupled to the second DLL and the first multiplexer, wherein an output of the first multiplexer is used as a timing signal for the delay stages coupled to the second DLL; a second multiplexer is coupled to the delay stages coupled to the second DLL; and a state machine component coupled to the clock signal and the second multiplexer, the state machine component configured to produce a digital pulse width modulation signal having a duration that is substantially equal to the difference between the second delay and the first delay. In one embodiment, the stage machine component comprises an R/S latch having a "set" input coupled to the input clock signal and a "reset" input coupled to the second multiplexer. The delay stages in the second DLL may have substantially equal delay values or substantially different and monotonic delay values. In one embodiment, m=n−1.

In accordance with one embodiment, a method for producing a digital pulse-width modulation (DPWM) signal includes: receiving, at a first delay-locked loop (DLL) circuit, an input clock signal having a clock period, and locking the first DLL to a first stage delay to produce a first stage delay signal; receiving, at a second DLL circuit, the input clock signal, and locking the second DLL to a second stage delay to produce a second stage delay signal, wherein the second stage delay is greater than the first stage delay; and producing a DPWM signal having a width equal to the difference between the first stage delay and the second stage delay. Locking the first DLL includes producing a first multiplexer output, and locking the second DLL includes producing a second multiplexer output, wherein the first multiplexer output is used as a timing signal to produce the second multiplexer output.

The method may include producing, at a state machine component, a series of pulses based on an edge of the input clock signal and an edge of the second multiplexer output. In one embodiment, the first stage delay is equal to the clock period divided by a number n, and the second stage delay is equal to the clock period divided by a number n−1.

Another embodiment include accepting, at a DPWM logic circuit, a DPWM code, wherein the steps of locking the first and second DLLs includes receiving respective first and second control signal from the DPWM logic circuit and locking the first and second DLLs in accordance with the first and second control signals.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A pulse width modulation circuit comprising:
   a first delay-locked loop (DLL) circuit coupled to a first multiplexer and having a first set of delay stages, wherein the first DLL circuit is configured to receive an input clock signal and, through the first multiplexer, produce a first stage delay signal associated with the first set of delay stages, wherein the first stage delay signal leads the input clock signal by a first duration; and
   a second DLL circuit coupled to a second multiplexer and having a second set of delay stages, wherein the second DLL circuit is configured to receive the input clock signal and, through the second multiplexer, produce a second stage delay signal associated with the second set of delay stages, wherein the second stage delay signal lags the first stage delay signal by a second duration;
   wherein the first DLL circuit and second DLL circuit are operatively coupled to produce an output signal having a pulse width equal to the difference between the first duration and the second duration.

2. The circuit of claim 1, wherein the first DLL circuit includes a first number of delay stages, the second DLL circuit includes a second number of delay stages, and the second number is equal to the first number minus one.

3. The circuit of claim 2, wherein the first number of delay stages is $2^N$, the second number of delay stages is $2^N-1$ and N is a positive integer.

4. The circuit of claim 1, wherein the first DLL circuit includes a first phase detector coupled to the input clock signal and the first set of delay stages, and wherein the second DLL circuit includes a second phase detector coupled to the input clock signal and the second set of delay stages.

5. The circuit of claim 1, wherein an output of the first multiplexer is used as a timing signal for the second multiplexer.

6. The circuit of claim 5, further including a logic circuit coupled to the first multiplexer and the second multiplexer, the logic circuit configured to accept a digital pulse width modulation code and send a corresponding first control code to the first multiplexer and a second control code to the second multiplexer.

7. The circuit of claim 5, further including a state machine component configured to produce the output signal based on an edge of the input clock signal and an edge of an output of the second multiplexer.

8. The circuit of claim 7, wherein the state machine comprises an R/S latch, and wherein the output signal is based on a rising edge of the input clock signal and a falling edge of the output of the second multiplexer.

9. The circuit of claim 1, wherein the second set of delay stages includes a plurality of delay stages having substantially equal delays.

10. The circuit of claim 1, wherein the second set of delay stages includes a plurality of delay stages, each having a substantially different and monotonically increasing delay.

11. A digital pulse width modulation (DPWM) circuit comprising:
   a first digital locked loop (DLL) coupled to an input clock signal having a period T, wherein the first DLL includes n delay stages having a first delay, T/n;
   a first multiplexer coupled to the first DLL;
   a second DLL coupled to the input clock signal, wherein the second DLL includes m delay stages having a second delay, T/(m), where n>m;
   a second set of m delay stages having the second delay and coupled to the second DLL;

a second multiplexer coupled to the second set of m delay stages and the first multiplexer, wherein an output of the first multiplexer is used as a timing signal for the second set of m delay stages; and a state machine component coupled to the clock signal and the second multiplexer, the state machine component configured to produce a digital pulse width modulation signal having a width that is substantially equal to the difference between the second delay and the first delay.

12. The circuit of claim 11, wherein m=n−1.

13. The circuit of claim 11, wherein the stage machine component comprises an R/S latch having a "set" input coupled to the input clock signal and a "reset" input coupled to the second multiplexer.

14. The circuit of claim 11, further including a logic circuit coupled to the first multiplexer and the second multiplexer, the logic circuit configured to receive a digital pulse width modulation code and send a corresponding first control code to the first multiplexer and a second control code to the second multiplexer.

15. The circuit of claim 11, wherein the delay stages in the second DLL have substantially different and monotonic delay values.

16. A method for producing a digital pulse-width modulation (DPWM) signal, the method comprising:

receiving, at a first delay-locked loop (DLL) circuit, an input clock signal having a clock period, and locking the first DLL to a first stage delay with respect to the input clock signal to produce a first stage delay signal;

receiving, at a second DLL circuit, the input clock signal, and locking the second DLL to a second stage delay with respect to the first stage delay signal to produce a second stage delay signal, wherein the second stage delay is greater than the first stage delay; and producing a DPWM signal having a pulse width substantially equal to the difference between the first stage delay and the second stage delay.

17. The method of claim 16, wherein locking the first DLL includes producing a first multiplexer output, and locking the second DLL includes producing a second multiplexer output, wherein the first multiplexer output is used as a timing signal to produce the second multiplexer output.

18. The method of claim 16, wherein producing the DPWM signal includes producing, at a state machine component, a series of pulses based on an edge of the input clock signal and an edge of the second multiplexer output.

19. The method of claim 16, wherein the first stage delay is equal to the clock period divided by a number n, and the second stage delay is equal to the clock period divided by a number n−1.

20. The method of claim 17, further including accepting, at a DPWM logic circuit, a DPWM code, wherein the steps of locking the first and second DLLs includes receiving respective first and second control signal from the DPWM logic circuit and locking the first and second DLLs in accordance with the first and second control signals.

* * * * *